United States Patent

Yoshida

[11] Patent Number: 6,144,587
[45] Date of Patent: Nov. 7, 2000

[54] SEMICONDUCTOR MEMORY DEVICE

[75] Inventor: Souichirou Yoshida, Tokyo, Japan

[73] Assignee: NEC Corporation, Tokyo, Japan

[21] Appl. No.: 09/337,791

[22] Filed: Jun. 22, 1999

[30] Foreign Application Priority Data

Jun. 23, 1998 [JP] Japan .................................. 10-175809

[51] Int. Cl.[7] .................................................. G11C 16/04
[52] U.S. Cl. .............................. 365/189.05; 365/189.04
[58] Field of Search ........................ 365/189.05, 189.04, 365/189.01, 189.12

[56] References Cited

U.S. PATENT DOCUMENTS

| | | | |
|---|---|---|---|
| 5,146,428 | 9/1992 | Tanimura | 365/189.08 |
| 5,226,009 | 7/1993 | Arimoto | 365/189.04 |
| 5,561,633 | 10/1996 | Yamano | 365/189.01 |
| 5,654,912 | 8/1997 | Hasegawa et al. | 365/189.12 |
| 5,708,618 | 1/1998 | Toda et al. | 365/189.12 |
| 5,721,862 | 2/1998 | Sartore et al. | 395/445 |

FOREIGN PATENT DOCUMENTS 11-86559  3/1999  Japan .

*Primary Examiner*—Amir Zarabian
*Assistant Examiner*—Anh Phung
*Attorney, Agent, or Firm*—Darryl G. Walker

[57] ABSTRACT

According to one embodiment, a semiconductor memory device can include a synchronous dynamic random access memory array and a register array formed from static random access memory cells. The memory device can be used in image processing, and reduce the time for data reads and writes during image reset operations. One embodiment (100) can include a memory cell array (102) having a number of memory cells arranged in rows and columns, and a register array (104) that includes a number of channel registers (106-11 to 106-mn) arranged rows and columns that correspond to at least a portion of the memory cell array rows and columns. The memory cells of a first column and the registers of a corresponding column are connected to one another by data transfer buses (108-1T/108-1N to 108-mT/108-mN). Data values can be written to memory cells and corresponding channel registers (106-11 to 106-mn) at the same time. Alternatively, data can be transferred between memory cells and corresponding channel registers (106-11 to 106-mn).

20 Claims, 3 Drawing Sheets

SEMICONDUCTOR MEMORY DEVICE

TECHNICAL FIELD

The present invention relates generally to semiconductor memory devices, and more particularly to virtual channel memories that can have a memory cell array that includes a number of memory cells arranged into one or more arrays and a register array that includes a number of registers arranged into a corresponding array(s).

BACKGROUND OF THE INVENTION

Semiconductor memory devices include dynamic random access memories (DRAMs). Recently, the mainstream use of DRAMs has shifted toward synchronous DRAMs (SDRAMs). A virtual channel SDRAM (VCSDRAM) has been proposed in Japanese Patent Application No. Hei 9-290233. VCSDRAMs can be desirable as they can further increase an access speed for a SDRAM.

A virtual channel memory, such as a VCSDRAM, can include a memory cell array having a number of memory cells, such as DRAM memory cells arranged in a row direction and a column direction. In addition, a virtual channel memory can also include a register array having registers arranged into a predetermined number of rows and a predetermined number of columns. The register array rows and columns can correspond to the rows and columns in the memory cell array. The register array can take the form of a static random access memory (SRAM) and have a cache function.

One particular type of system that can utilize DRAMs is a parallel processing system. A parallel processing system can include a number of central processing units (CPUs) and a number of controllers that are connected to bus lines. The bus lines are connected to a register array that is combined with a memory cell array. The register array can operate as a cache memory. In the parallel processing arrangement, one cache memory can be used by a plurality of CPUs and a plurality of controllers. Such an arrangement can lead to a more simplified system structure.

One particular application for a VCSDRAM is that of a graphic memory. A graphic memory can store image data. In many graphic memory operations, the same data (e.g., "0" or "1") is frequently written into or read from a large number of memory cells at the same time. One example of such an operation is when image data is reset. Accordingly, when a VCSDRAM is used as a graphic memory, the same data is frequently stored in the memory cell array and the register array. In a conventional approach, when the same data is to be written into a memory cell array and the register array, the write data will be written from external input/output pins to the memory cell array and the register array one by one. For example, if a register array includes registers arranged in an m×n array, data can be written into m×n memory cells. The same data must then be written into m×n registers of the register array. As a result, image reset operations can consume a considerable amount of time.

In light of the above, it would be desirable to provide a memory device that may be used with image processing that can reduce the period of time required for reading or writing data when an image is reset. It would also be desirable that such a memory device be a VCSDRAM.

SUMMARY OF THE INVENTION

In light of the above drawbacks, an object of the present invention is to provide a semiconductor memory device that may be used in image processing that can reduce the amount of time for a data read or write during an image reset operation. Such a semiconductor memory device can be a virtual channel synchronous dynamic random access memory device (VCSDRAM).

According to the present invention, one embodiment can include a semiconductor memory device having a memory cell array and a register array. The memory cell array can include a number of memory cells arranged into one or more arrays having rows and columns. The register array can include a number of registers arranged into an array having rows and columns that correspond to at least one portion of a memory cell array. The embodiment can further include a data writing means for writing data into a memory cell of a first column and a corresponding first register at the same time. The memory cell of the first column and corresponding first register can be connected to each other through a transfer bus line.

According to one aspect of the invention, when the same data value is to be written into a memory cell and a register, the data can be written to the memory cell and the register at the same time. This can result in reduced data write times.

According to another aspect of the invention, memory cells of the virtual channel memory can take a variety of forms. As just one example, the memory cells can include high-resistance load DRAM cells.

According to another aspect of the invention, registers of the virtual channel memory can take a variety of forms. As just one example, the registers can include static RAM (SRAM) cells.

According to one embodiment, data can be written into a memory cell of a first column and a corresponding register independently. Data can then be transferred between the memory cell of the first column and the corresponding first register. In this arrangement the degrees of freedom available for write operations are increased.

According to one embodiment, the data writing means may receive input data from external bus lines. The data writing means may include switching means that connect the external bus lines to transfer bus lines in response to an external signal.

According to one embodiment, the data writing means may include a write data producing means. In such an arrangement, the data writing means may include switching means that connect transfer bus lines to a predetermined power supply voltage in response to an external signal.

According to one embodiment, the data writing means can write internally generated data values to a memory cell in a first column and a corresponding register at the same time. This can result in faster transfer of data within the device.

DETAILED DESCRIPTION OF THE EMBODIMENTS

Figure 1:
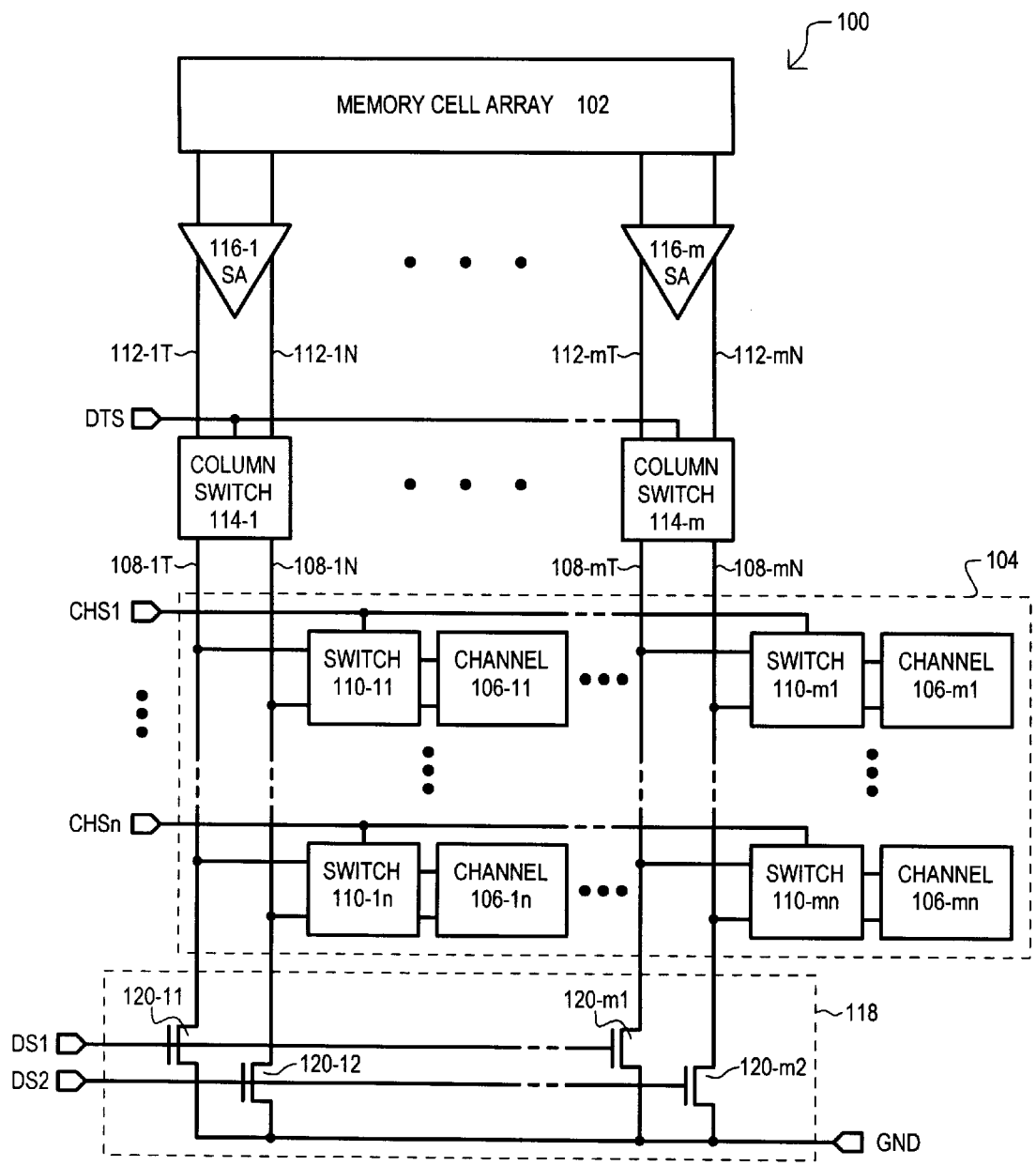
FIG. 1 is a block diagram illustrating a virtual channel memory according to a first embodiment.

Various embodiments of the present invention will now be described with reference to a number of drawings. FIG. 1 is a block diagram showing the structure of a virtual channel memory (such as a virtual channel synchronous dynamic random access memory, or VCSDRAM) according to a first embodiment. The virtual channel memory is designated by the general reference character 100, and is shown to include a memory cell array 102 and a register array 104. A memory cell array 102 can include a large number of memory cells, which are arranged in a row direction and column direction to form one or more arrays.

A register array 104 can include a number of "channel" registers (referred hereinafter as "channels"). In the particular arrangement of FIG. 1, the register array 104 includes channels arranged into "n" rows and "m" columns. Exemplary channels are identified in FIG. 1 as 106-11 to 106-1n and 106-m1 to 106-mn. The number of rows and columns of channels within the register array 104 can be related to the number of rows and columns in the memory cell array 102. For example, the memory cell array 102 can include i×n rows and j×m columns, where i and j are integers.

In one particular embodiment, the memory cells of memory cell array 102 can be dynamic random access memory (DRAM) cells. The channels (106-11 to 106-mn) of register array 104 can be static RAM (SRAM) cells.

Referring once again to FIG. 1, the n channels of each column in the register array 104 can be connected to corresponding data transfer buses by switches. In particular, channels 106-11 to 106-1n are coupled to data transfer bus 108-1T/108-1N by switches 110-11 to 110-1n, respectively. Channels 106-m1 to 106-mn are coupled to data transfer bus 108-mT/108-mN by switches 110-m1 to 110-mn, respectively.

Data transfer buses (108-1T/108-1N to 108-mT/108-mN) can be connected to digit lines by column switches. In the particular arrangement of FIG. 1, data transfer bus 1081T/108-1N is shown to be connected to digit line pair 112-1T/112-1N by column switch 114-1, and data transfer bus 108-mT/108-mN is shown to be connected to digit line pair 112mT/112-mN by column switch 114-m. Each column switch (114-1 to 114-m) can have the function of arbitrarily switching between a number of digit line pairs. In particular, such switching can occur between j such digit line pairs, where the number of columns in the memory cell array 102 includes j×m columns. The value j could be "4," as just one example.

FIG. 1 also includes a number of sense amplifiers (116-1 to 116-m) disposed between the memory cell array 102 and the digit line pairs (122-1T/112-1N to 112-nT/112-mN). Sense amplifiers (116-1 to 116-m) can amplify data, and may serve to transmit data between their corresponding digit line pairs (122-1T/112-1N to 112-nT/112-mN) and respective memory cells.

In the arrangement of FIG. 1, one end of the data transfer buses (108-1T/108-1N to 108-mT/108-mN) is coupled to a write data producing section 118. The particular write data producing section 118 of FIG. 1 is shown to include n-channel transistors 120-11/120-12 to 120-m1/120-m2 connected between the data transfer buses 108-1T/108-1N to 108-mT/108-mN and a GND potential. The gates of transistors 120-11 to 120-m1 receive a data write signal DS1. The drains of transistors 120-11 to 120-m1 are connected to one line of a corresponding data transfer bus 108-1T to 108-mT. The sources of transistors 120-11 to 120-m1 are connected to a voltage GND. The gates of transistors 120-12 to 120-m2 receive a data write signal DS2. The drains of transistors 120-12 to 120-m2 are connected the other line of a corresponding data transfer bus 108-1N to 108-mN. The sources of transistors 120-12 to 120-m2 are connected to the voltage GND. One skilled in the art would recognize that a transistor can provide a controllable impedance path between its respective source and drain. Such a path may include high and low impedance states. Further, the n-channel transistors illustrated show but one example of an insulated gate field effect transistor (IGFET) that may be used in the particular embodiment.

In FIG. 1, a data transfer signal DTS is received by column switches (114-1 to 114-m). In this arrangement, column switches (114-1 to 114-m) can be turned on or off together. Each row of switches within the register array 104 receives a channel select signal. In particular, switches 110-11 to 110-m1 receive the channel select signal CHS1, and switches 110-1n to 110-mn receive the channel select signal CHSn. In this arrangement, the switches of each row in the register array 104 can be turned on or off together.

According to the particular embodiment set forth in FIG. 1, because the column switches 114-1 to 114-m can be turned on at the same time by the data transfer signal DTS, all of the m columns can be selected at the same time. As a result, data can be read from or written between a channel (106-11 to 106-mn) and a memory cell of a corresponding column in response to a channel select signal (CHS1 to CHSn).

Alternatively, the same data can be supplied to a channel (106-11 to 106-mn) and a memory cell of a corresponding column at the same time in a write operation. This write operation can write data to memory cells within m columns in the memory cell array 102 and m columns in the register array 104, at the same time. Such a write operation can result in high speed resetting of data in the case of a virtual channel memory that is used to process image data.

Various operation modes for a VCSDRAM according to particular embodiments will now be described. A VCSDRAM according to one embodiment can include at least a first, second, third and fourth operation mode. In a first operation mode, the same data, for example a "0" or a "1" can be written into a row of memory cells. In a second operation mode, the same data can be written into a row of channels. In a third operation mode, the same data can be written into a row of memory cells and a row of channels at the same time. In fourth operation mode, data can be transferred between a row of memory cells and a row of channels.

For the particular embodiment of FIG. 1, prior to the described operation modes, the data transfer bus line pairs 108-1T/108-1N to 108-mT/108-mN can be precharged to an arbitrary voltage other than the GND voltage.

In the first operation mode, a row address can be applied to the VCSDRAM by a central processing unit (CPU) or the like, and a row can be selected within memory cell array 102. The data transfer signal DTS can be activated and a data write signal DS1 can also be activated (driven high, in FIG. 1). One data bus transfer line 108-1T to 108-mT from each data bus transfer line pair will be driven to a lower potential than the other data bus transfer line 108-1N to 108-mN of its corresponding data bus transfer line pair.

Because the column switches (114-1 to 114-m) are activated, one digit line 112-1T to 112-mT from each digit line pair will be driven to a lower potential than the other digit line 112-1N to 112-mN of its corresponding digit line pair.

Sense amplifiers 116-1 to 116-m can be activated, and the same data (for example, a logic "1" established by the activation of the data write signal DS1) can be written to memory cells of the same row within the memory cell array 102. It is understood that in the particular arrangement of FIG. 1, when the data write signal DS2 is activated (driven high, in FIG. 1), a different logic value (for example a logic "0") can be written to memory cells of the same row within the memory cell array 102. In this way, a row of m data having logic values of "0" or "1" can be written into memory cells at the same time.

In the second operation mode, one of the channel select signals (CHS1 to CHSm) is activated by a CPU or the like, instead of the data transfer signal DTS, as is the case in the first operation mode. A row of channels selected by the activated channel select signal can be reset to a logic "0" or "1" value, according to whether the DS1 or DS2 signal is activated. This can enable a row of channels to be "reset" to a particular logic value at a high speed.

In the third operation mode, a row of memory cells can be selected in the same general fashion as the first operation mode. In addition, one of the channel select signals (CHS1 to CHSm) can be activated. The operation can continue in the same fashion as the first operation mode. As a result, data values of logic "0" or "1" can be written into a row of memory cells within the memory cell array 102 and a row of channels within the register 104 at the same time.

In the fourth operation mode, a row address can be applied and a row can be selected within memory cell array 102. In addition, the data transfer signal DTS can be activated and one of the channel select signals (CHS1 to CHSm) can be activated. At the same time, the data transfer signals (DS1 and DS2) can remain inactive (low in the particular arrangement of FIG. 1). In this way data values can be transferred between a row of channels in the register array 104 and a row of memory cells in the memory cell array 102.

In a conventional approach employing memory cells and a cache memory, when the same data values (such as logic "0" and logic "1") are to be written into a row of the cache and a row memory cells, an initial write operation to the cache is performed to "reset" a cache row to the desired same data values. A subsequent write (or "restore") operation is then performed to write the same data values to a row of memory cells. In contrast, according to one embodiment of the present invention, the same data values can be written into a row of memory cells and a row of channels by only one write (restore) operation. Consequently, when a virtual channel memory according to such an embodiment is used for image processing, the reset process can be executed at a faster speed.

Figure 2:
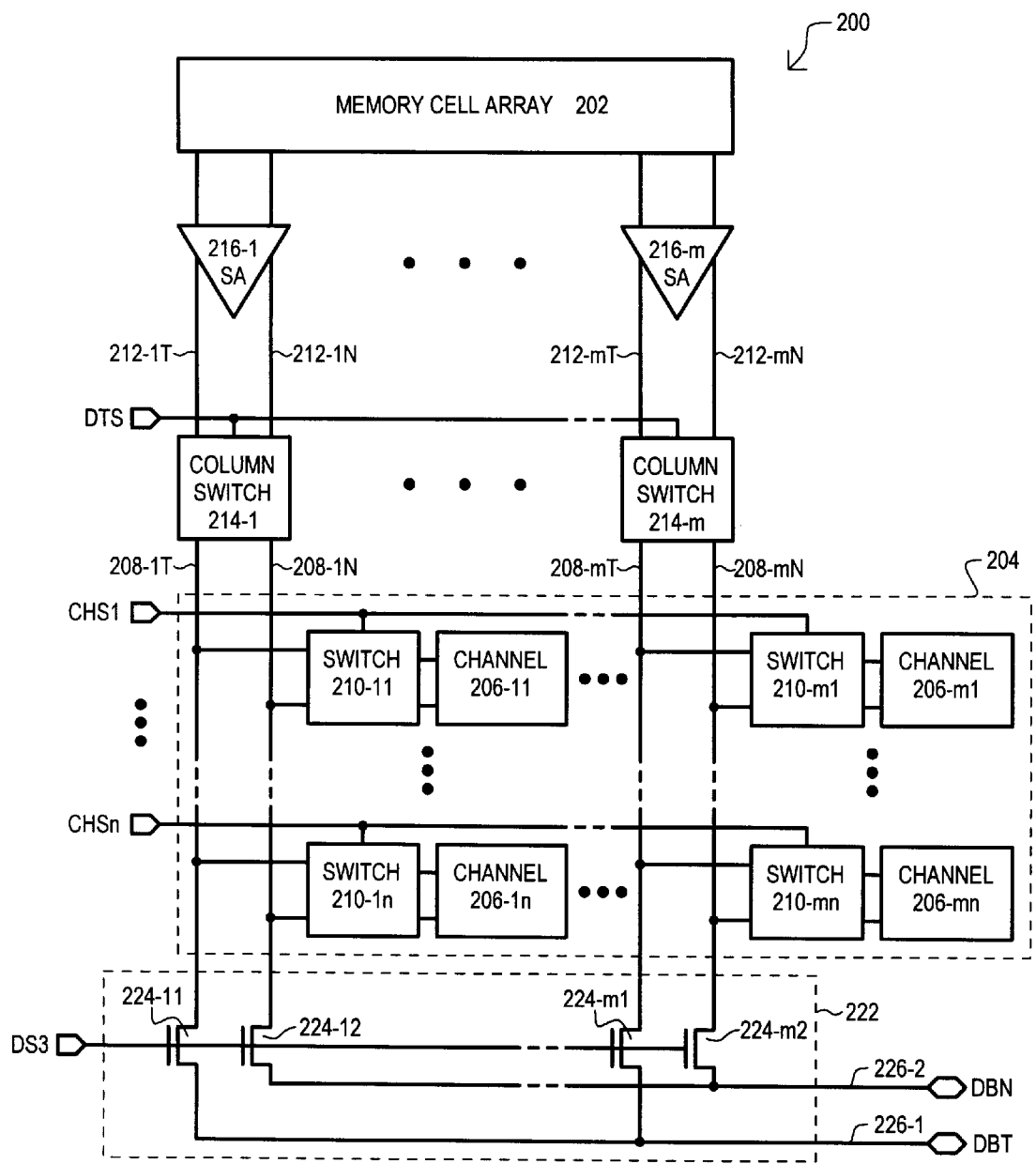
FIG. 2 is a block diagram illustrating a virtual channel memory according to a second embodiment.

FIG. 2 is a block diagram of a VCSDRAM according to a second embodiment. The second embodiment can include many of the same general constituents as the first embodiment 100. To that extent, like items will be referred to with the same reference character, but with the first digit being a "2" instead of a "1." The second embodiment 200 can differ from the first embodiment 100 in that it can include a data transfer section 222 instead of a write data generating section.

The data transfer section 222 is shown to include n-channel transistors 224-11/224-12 to 224-m1/224-m2. The n-channel transistors 224-11/224-12 to 224-m1/224-m2 connect data transfer bus lines 208-1T/208-1N to 208-mT/208-mN to an external data bus 226-1/226-2. In the particular arrangement of FIG. 2, n-channel transistors 224-11/224-12 to 224m1/224-m2 are connected by their drains to data transfer bus lines 208-1T/208-1N to 208mT/208-mN, respectively. The sources of n-channel transistors 224-11 to 224-m1 are connected to external data bus line 226-1and the sources of n-channel transistors 224-12 to 224-m2 are connected to external data bus line 226-2. External bus lines 226-1/226-2 may carry signals DBT/DBN. respectively. The gates of the n-channel transistors 224-11/224-12 to 224-m1/224-m2 are connected to a data write signal DS3.

In the particular second embodiment of FIG. 2, data can be transferred between the external data bus 226-1/226-2 and various portions of the virtual channel memory (e.g., memory cells and/or registers) in the same general fashion as the first embodiment 100.

Figure 3:
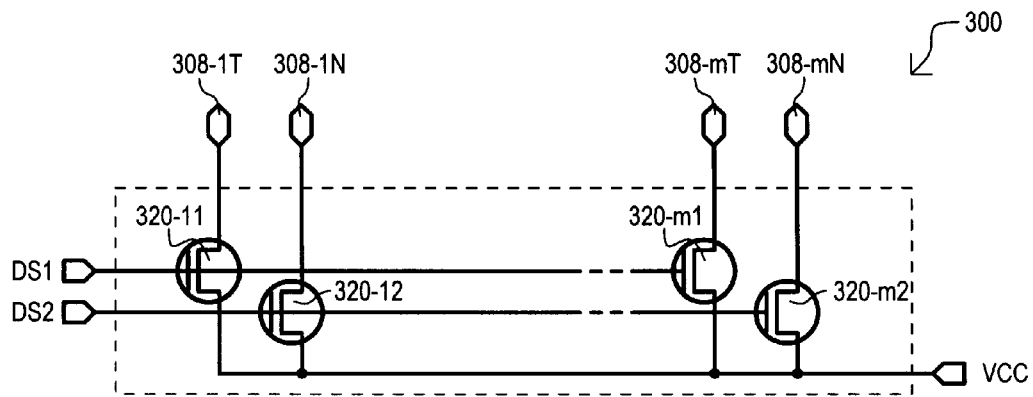
FIG. 3 is a schematic diagram of an alternate write data producing section that may be used in an embodiment.

FIG. 3 is a schematic diagram of a write data producing section that may be used in the VCSDRAM of the first embodiment 100. The write data producing section of FIG. 3 is designated by the general reference character 300 and is shown to include p-channel transistors 320-11/320-12 to 320-m1/320-m2. One way in which the write data producing section 300 differs from that illustrated in FIG. 1 is that the n-channel transistors of FIG. 1 have been replaced by p-channel transistors. In addition, the sources of the p-channel transistors (320-11/320-12 to 320-m1/320-m2) are coupled to a high power supply line VCC.

In the arrangement of FIG. 3, one data transfer line of each data transfer line pair 308-1T/308-1N to 308-mT to 308-mN is driven to a logic high level to establish the logic "0" or "1" data values. Such data values can be established by the data write signals DS1 and DS2.

Figure 4:
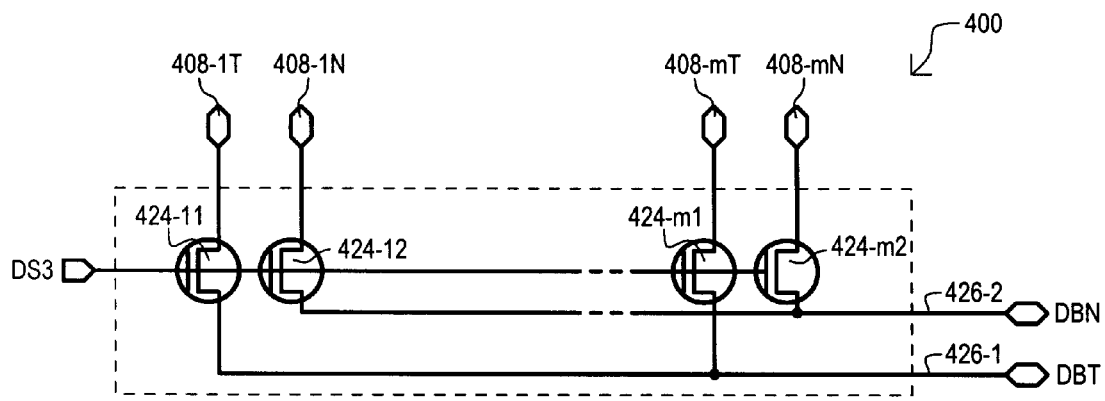
FIG. 4 is a schematic diagram of an alternate data transfer section that may be used in an embodiment.

FIG. 4 is a schematic diagram of a data transfer section 400 that may used in the VCSDRAM of the second embodiment 200. The data transfer section 400 of FIG. 4 is designated by the general reference character 400 and is shown to include p-channel transistors 424-11/424-12 to 424-m1/424-m2. FIG. 4 also shows external bus lines 426-1and 426-2 and data transfer line pairs 408-1T/408-1N to 408-mT/408-mN. External bus lines 426-1/426-2 may carry signals DBT/DBN respectively. One way in which the write data producing section 400 differs from that of FIG. 2 is that the n-channel transistors of FIG. 2 have been replaced by p-channel transistors.

As described above, according to the present invention, a data value of logic "0" or "1" can be set in a channel register and a memory cell at the same time. This can allow for data transfers at high speeds.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:

a memory cell array that includes a plurality of memory cells arranged into a predetermined number of rows and a predetermined number of columns;

a register array that includes a plurality of registers arranged into a predetermined number of register rows and a predetermined number of register columns that correspond to at least a portion of the rows and columns of the memory cell array;

a plurality of transfer bus lines that couple columns of memory cells to corresponding channel registers; and data writing means for writing data into a plurality of memory cells and corresponding registers at the same time.

2. The semiconductor memory device of claim 1, wherein:
data can be written into a plurality of memory cells and corresponding registers independently.

3. The semiconductor memory device of claim 1, wherein:
data can be transferred between a plurality of memory cells and corresponding registers.

4. The semiconductor memory device of claim 1, wherein:
the data writing means can receive external data values.

5. The semiconductor memory device of claim 1, wherein:
the data writing means includes switching means that can receive an external signal and connect a plurality of transfer bus lines to external bus lines.

6. The semiconductor memory device of claim 1, wherein:
the data writing means can receive an external signal and produce data values to be written.

7. The semiconductor memory device of claim 6, wherein:
the data writing means includes switching means that can receive an external signal and connect a plurality of transfer bus lines to a power supply line.

8. The semiconductor memory device of claim 1, wherein:
the data writing means can write the same data values to a plurality of memory cells and a plurality of registers at the same time.

9. A semiconductor memory device, comprising:
a memory cell array that includes a plurality of memory cells arranged into array columns;
a register array that includes a plurality of registers arranged into a number of register columns, the register columns corresponding to at least a portion of the array columns;
a plurality of transfer bus lines coupled between the register columns and at least a portion of the array columns; and
a write data generating circuit coupled to the transfer bus lines that includes controllable impedance paths disposed between a first predetermined logic value and the transfer bus lines, the controllable impedance paths being commonly controlled by a first data write signal.

10. The semiconductor memory device of claim 9, wherein:
the controllable impedance paths of the write data generating circuit include insulated gate field effect transistors (IGFETs).

11. The semiconductor memory device of claim 10, wherein:
the IGFETs of the write data generating circuit include n-channel IGFETs.

12. The semiconductor memory device of claim 10, wherein:
the IGFETs of the write data generating circuit include p-channel IGFETs.

13. The semiconductor memory device of claim 9, wherein:
the write data generating circuit further includes controllable impedance paths disposed between a second predetermined logic value and the transfer bus lines, the controllable impedance paths being commonly controlled by a second data write signal.

14. The semiconductor memory device of claim 13, wherein:
the plurality of transfer bus lines includes transfer bus line pairs; and
the write data generating circuit includes first IGFETs coupled to one transfer bus line of each transfer bus line pair and second IGFETs coupled to the other transfer bus line of each transfer bus line pair, the first IGFETs being activated by a first data write signal, the second IGFETs being activated by a second data write signal.

15. The semiconductor memory device of claim 14, wherein:
the same predetermined logic value is a power supply voltage.

16. A semiconductor memory device, comprising:
a plurality of memory cells arranged into a memory cell array;
a plurality of register circuits arranged into a register array;
a plurality of data transfer lines coupled between the register array and at least a portion of the memory cell array; and
a data transfer circuit that includes a plurality of commonly controllable impedance paths that couple a predetermined logic value to a plurality of data transfer lines.

17. The semiconductor memory device of claim 16, wherein:
the semiconductor memory device includes a register write mode that provides low impedance paths between the predetermined logic value and a plurality of register circuits, the low impedance paths including the controllable impedance paths.

18. The semiconductor memory device of claim 16, wherein:
the semiconductor memory device includes a register and array write mode that provides low impedance paths between the predetermined logic value and a plurality of register circuits and a corresponding plurality of memory cells, the low impedance paths including the controllable impedance paths.

19. The semiconductor memory device of claim 16, wherein:
each register circuit includes a static random access memory cell.

20. The semiconductor memory device of claim 19, wherein:
each register circuit further includes a switch that couples a static random access memory cell to at least one data transfer line.

* * * * *